United States Patent
Lo et al.

(10) Patent No.: US 11,668,768 B2
(45) Date of Patent: Jun. 6, 2023

(54) MAGNETOMETER AND METHOD OF DETECTING A MAGNETIC FIELD

(71) Applicant: UCL BUSINESS LTD, London (GB)

(72) Inventors: Cheuk Chi Lo, London (GB); Gary Wolfowicz, London (GB); Philipp Ross, London (GB); John Morton, London (GB)

(73) Assignee: UCL BUSINESS LTD, London (GB)

( * ) Notice: Subject to any disclaimer, the term of this patent is extended or adjusted under 35 U.S.C. 154(b) by 244 days.

(21) Appl. No.: 17/251,580

(22) PCT Filed: Jun. 13, 2019

(86) PCT No.: PCT/GB2019/051641
§ 371 (c)(1),
(2) Date: Dec. 11, 2020

(87) PCT Pub. No.: WO2019/239137
PCT Pub. Date: Dec. 19, 2019

(65) Prior Publication Data
US 2021/0255254 A1    Aug. 19, 2021

(30) Foreign Application Priority Data
Jun. 13, 2018 (GB) ...................... 1809706

(51) Int. Cl.
*G01R 33/02* (2006.01)
(52) U.S. Cl.
CPC .................... *G01R 33/02* (2013.01)
(58) Field of Classification Search
None
See application file for complete search history.

(56) References Cited

U.S. PATENT DOCUMENTS

| 8,547,090 B2 | 10/2013 | Lukin et al. |
| 8,947,080 B2 | 2/2015 | Lukin et al. |

(Continued)

FOREIGN PATENT DOCUMENTS

GB    2483767 A    3/2012

OTHER PUBLICATIONS

Great Britain Intellectual Property Office Search Report for Application No. GB1809706.3, dated Dec. 11, 2018.

(Continued)

*Primary Examiner* — Douglas X Rodriguez
(74) *Attorney, Agent, or Firm* — Womble Bond Dickinson (US) LLP

(57) ABSTRACT

The disclosure concerns a magnetometer for detecting a magnetic field, comprising: a solid state electronic spin system containing a plurality of electronic spins and a solid carrier, wherein the electronic spins are configured to be capable of aligning with an external magnetic field in response to an alignment stimulus; and a detector configured to detect an alignment response of the electronic spins, such that the external magnetic field can be detected; wherein the electronic spins are provided as one or more groups, each group containing a plurality of spins, the plurality of spins in each of the one or more groups being arranged in a line that is angled at an angle Θ with respect to the local direction of the external magnetic field at the said group. Also disclosed is a method for detecting a magnetic field.

17 Claims, 6 Drawing Sheets

(56) References Cited

U.S. PATENT DOCUMENTS

| | | |
|---|---|---|
| 9,416,005 B2 | 8/2016 | Scarsbrook et al. |
| 10,281,550 B2 * | 5/2019 | Sinton .................... G01R 33/60 |
| 2010/0315079 A1 | 12/2010 | Lukin et al. |
| 2015/0374250 A1 | 12/2015 | Hatano et al. |

OTHER PUBLICATIONS

Lo, C. C. et al., "Hybrid optical-electrical detection of donor electron spins with bound excitons in silicon," Mar. 23, 2015, Nature Materials, vol. 14, Macmillan Publishers Limited, www.nature.com/naturematerials.

Zadrozny, Joseph M. et al., "Millisecond Coherence Time in a Tunable Molecular Electronic Spin Qubit," ACS Central Science Journal, Dec. 2, 2015, vol. 1, pp. 488-492, ACS Publications, American Chemical Society, nttps://pubs.acs.org/journal/acscii.

Lam, S. K. H. et al., "Attachment of magnetic molecules on a nanoSQUID," Nanotechnology, Jun. 2, 2008, vol. 19, No. 28, IOPscience, https://iopscience.iop.org/article/10.1088/0957-4484/19/28/285303.

Roberto Lo Nardo et al., "Spin relaxation and donor-acceptor recombination of Se+ in 28-silicon," Physical Review, Oct. 7, 2015, B 92, 165201, https://journals.aps.org/prb/abstract/10.1103/PhysRevB.92.165201.

Lo, C. C. et al., "Stark shift and field ionization of arsenic donors in 28Si-silicon-on-insulator structures," Applied Physics Letters, May 2014, 104, 193502, AIP Publishing LLC, http://dx.doi.org/10.1063/1.4876175.

Tyryshkin, A. M. et al., "Coherence of Spin Qubits in Silicon," 76.30.-v, 03.67.Lx, 71.55.Cn, 71.55.-i.

George, Richard E. et al., "Electron spin coherence and electron nuclear double resonance of Bi donors in natural Si," Physical Review Letters, Aug. 2010, 10.1103/PhysRevLett.105.067601, https://www.researchgate.net/publication/46424552.

Fyryshkin, Alexei M. et al., "Electron spin coherence exceeding seconds in high purity silicon.".

Jelezko, F. et al., "Observation of Coherent Oscillations in a Single Electron Spin," Physical Review Letters, Feb. 20, 2004, vol. 92, No. 7, The American Physical Society.

Bar-Gill, N. et al., "Solid-state electronic spin coherence time approaching one second," Nature Communications, Apr. 23, 2013, Macmillan Publishers Limited, www.nature.com/naturecommunications.

Balasubramanian, Gopalakrishnan et al., "Ultralong spin coherence time in isotopically engineered diamond," Nature Materials, Apr. 6, 2009, vol. 8, Macmillan Publishers Limited, https://www.researchgate.net/publication/24260965.

Pingault, Benjamin et al., "Coherent control of the silicon-vacancy spin in diamond," Nature Communications, May 30, 2017.

Rogers, Lachlan J et al., "All-Optical Initialization, Readout, and Coherent Preparation of Single Silicon-Vacancy Spins in Diamond," Physical Review Letters, Dec. 31, 2014, vol. 113, Iss. 26, The American Physical Society, ittps://journals.aps.org/prl/abstract/10.1103/PhysRevLett.113.263602.

Siyushev, Petr et al., "Optical and microwave control of germanium-vacancy center spins in diamond," Physical Review, Aug. 2017, vol. B 96, Iss. 8, The American Physical Society, https://journals.aps.org/prb/abstract/10.1103/PhysRevB.96.081201.

Bhaskar, M. K. et al., "Quantum Nonlinear Optics with a Germanium-Vacancy Color Center in a Nanoscale Diamond Waveguide," Jun. 2017.

Rose, Brendon C. et al., "Observation of an environmentally insensitive solid-state spin defect in diamond," Science, Jul. 6, 2018, vol. 361, American Association for the Advancement of Science, Washington, D.C., United States, http://science.sciencemag.org/content/361/6397/60.

Knowles, Helena S. et al., "Observing bulk diamond spin coherence in high-purity nanodiamonds," Cavendish Laboratory, University of Cambridge, Cambridge, United Kingdom.

De Oliveira, Felipe et al., "Tailoring spin defects in diamond by lattice charging," Nature Communications, May 17, 2017, vol. 8.

Seo, Hosung et al., "Quantum decoherence dynamics of divacancy spins in silicon carbide," Nature Communications, Sep. 29, 2016, vol. 7.

Christle, David J. et al., "Isolated electron spins in silicon carbide with millisecond-coherence times."

Falk, Abram L. et al., "Polytype control of spin qubits in silicon carbide," Nature Communications, May 7, 2013, Macmillan Publishers Limited.

Carlos, W. E. et al., "Annealing of multivacancy defects in 4H-SiC," Physical Review, Dec. 1, 2006, vol. B 74, The American Physical Society.

Veldhorst, M. et al., "An addressable quantum dot qubit with fault-tolerant control fidelity," Jul. 9, 2014.

Baranov, Pavel G. et al., "Silicon vacancy in SiC as a promising quantum system for single-defect and single photon spectroscopy," Physical Review, Mar. 11, 2011, vol. B 83, Iss. 12, The American Physical Society, https://journals.aps.org/prb/issues/83/12.

Koehl, William F. et al., "Room temperature coherent control of defect spin qubits in silicon carbide," Nature, Nov. 2, 2011, vol. 479, https://doi.org/10.1038/nature10562.

Elzerman, J. M. et al., "Single-shot read-out of an individual electron spin in a quantum dot," Letters to Nature, Jul. 22, 2004, vol. 430, Nature Publishing Group.

Pla, Jerryd J. et al., "A single-atom electron spin qubit in silicon," Nature, Sep. 19, 2012, vol. 489, https://doi.org/10.1038/nature11449.

Babinec, Thomas M. et al., "A diamond nanowire single-photon source," Nature Nanotechnology, Feb. 14, 2010, vol. 5, Macmillan Publishers Limited.

Ohno, Kenichi et al., "Engineering shallow spins in diamond with nitrogen delta-doping," Applied Physics Letters, Jul. 2012, https://www.researchgate.net/publication/229075948.

Taylor, J.M. et al., "High-sensitivity diamond magnetometer with nanoscale resolution," May 9, 2008.

Lo, Chi Cheuk et al., "Spin-based silicon magnetometer," UCL Quantum spin dynamics presentation, May 13, 2015.

"Sensitivity trade-off between N and T2" presentation, 2015.

K. Jensen et al., "Cavity-enhanced room-temperature magnetometry using absorption by nitrogen-vacancy centers in diamond", Jan. 10, 2014, XP080001403, ARXIV.org, Cornell University Library, 201 Olin Library Cornell University, Ithica, NY.

Mutsuko Hatano et al., "Diamond electronics", Sep. 12, 2016, pp. 330-332, 46th European Solid-State Device Research Conference, XP032980760.

Search Report and Written Opinion for International Patent Application No. PCT/GB2019/051641, dated Sep. 5, 2019.

* cited by examiner

MAGNETOMETER AND METHOD OF DETECTING A MAGNETIC FIELD

CROSS-REFERENCE TO RELATED APPLICATIONS

This application is a U.S. National Stage filing under 35 U.S.C. § 371 of International Application No. PCT/GB2019/051641, filed on Jun. 13, 2019, which claims the benefit of priority to GB Application No. 1809706.3, filed on Jun. 13, 2018.

TECHNICAL FIELD

The present disclosure relates to a magnetometer and to a method of detecting a magnetic field.

BACKGROUND

U.S. Pat. No. 8,947,080 (Lukin et al), the contents of which are incorporated herein by reference, describes a magnetometer which includes a solid state electronic spin system and a detector. The solid state electronic spin system contains a plurality of electronic spins that are disposed at locations within a solid carrier which in that case is a single crystal diamond lattice supported by a suitable support structure within the magnetometer, for example attached to an optical waveguide 610 (see FIG. 6 of U.S. Pat. No. 8,947,080). Furthermore, each electronic spin is substantially free of magnetic interference from the carrier, particularly the remainder of the diamond lattice.

The spins disclosed in U.S. Pat. No. 8,947,080 are nitrogen vacancy (NV) centres within the diamond lattice. An NV centre is a crystallographic defect in the lattice structure of a single crystal diamond, and consists of an empty position in the diamond lattice and an adjacent interstitial atom of an impurity such as nitrogen. NV centres can absorb visible light and are visible as red spots when illuminated by a laser. The example of an approximately 25 nm diameter diamond nanocrystal with about 10 NV centres is described in the prior art.

The magnetometer detects an external magnetic field by utilising the effect that the plurality of electronic spins align with the external magnetic field in response to laser optical excitation radiation applied to the electronic spins.

The magnetic field strength can be quantified by utilising a quantitative effect on the spins that depends on the magnetic field strength. In U.S. Pat. No. 8,947,080, a radiofrequency (RF) field is applied to the spins aligned in the magnetic field. The RF field induces the spins to precess about the magnetic field, the frequency of the spin precession being linearly related to the magnetic field by the Zeeman shift of the electronic spin energy levels. By detecting output optical radiation from the electronic spin, the Zeeman shift can be determined and hence the magnetic field strength.

Desire for magnetometers capable of higher resolution of magnetic field mapping and greater sensitivity in the detection of the magnetic field promotes the use of higher densities of spins in the array of electronic spin locations (pixels). However, it has been found that magnetometer sensitivity is compromised as the spin density increases. Magnetometer sensitivity compromise can result from greater magnetic interference from mutual spin-spin interactions and/or from interactions with the solid state lattice, leading to a reduced spin coherence time of each spin. The cause of interactions between the spins may, for example, include dipolar coupling, or exchange coupling at very high concentrations.

It is further desirable, for miniaturisation and integration of the spins and pixels (sensing elements) containing spins onto electronic chips and other flat substrates, for the spin array to be capable of being made substantially flat (thereby providing a two dimensional planar array), rather than the three-dimensional array provided by a diamond crystal lattice.

The present disclosure is based on the surprising finding that at least some of the desirable properties discussed above may be obtained by arranging individual spins within an array in a line that is angled at a specific angle with respect to the local direction of the external magnetic field. A preferred value for the specific angle between the line of (S=½) spins and the local external magnetic field is at or near the so-called "magic angle" ($\theta_m$), which has a value of arccos $1/\sqrt{3}$ or arctan $\sqrt{2}$ (approximately 54.7°). At this preferred angle, the intrinsic interaction between spins is minimised, and preferably reduced to essentially zero.

Further aspects of embodiments disclose angling the line of (S=½) spins with respect to the local external magnetic field at other angles, greater or less than the "magic angle", said other angles being selected such that the intrinsic interaction between spins is substantially reduced in comparison with an analogous system in which no specific arrangement of the spins at the angle θ has been performed. The reduction in the intrinsic interaction may enable a magnetic field to be detected/measured at the desired sensitivity and spatial resolution.

Further aspects of embodiments disclose the use of higher spins (S>½) with some effective internal alignment axis (for example from a crystal field) for which the magic angle, at which the intrinsic interaction between the spins is minimised, differs from arccos $1/\sqrt{3}$.

BRIEF DESCRIPTION OF THE INVENTION

An aspect of an embodiment provides a magnetometer for detecting a magnetic field, comprising: a solid state electronic spin system containing a plurality of electronic spins and a solid carrier, wherein the electronic spins are configured to be capable of aligning with an external magnetic field in response to an alignment stimulus; and a detector configured to detect an alignment response of the electronic spins, such that the external magnetic field can be detected; wherein the electronic spins are provided as one or more groups, each group containing a plurality of spins, the plurality of spins in each of the one or more groups being arranged in a line that is angled at an angle θ with respect to the local direction of the external magnetic field at the said group. By arranging the spins in a line that is angled at an angle θ with respect to the local direction of the external magnetic field, the coherence time of the spins is increased relative to an unarranged system, thereby improving the sensitivity of the magnetometer.

The magnetometer may be further configured to perturb the alignment of the electronic spins in a manner quantitatively related to the magnetic field strength, and to quantitatively detect the response of the electronic spins to the perturbation, whereby the magnetic field strength can be measured based on the detected response to the perturbation. In this way, measurements of the magnetic field strength may be taken in addition to detecting the presence (and optionally direction) of the field.

A further aspect of an embodiment provides a method of detecting a magnetic field, comprising: applying an alignment stimulus to a solid state electronic spin system containing a plurality of electronic spins and a solid carrier, thereby aligning the electronic spins with the magnetic field; and detecting said alignment response of the electronic spins thereby detecting the magnetic field; wherein the electronic spins are provided in the solid state electronic spin system as one or more groups, each group containing a plurality of spins, the plurality of spins in each of the one or more groups being arranged in a line that is angled at an angle θ with respect to the local direction of the magnetic field at the said group. The method provides improved sensitivity relative to other method for detecting a magnetic field.

The method may further comprise perturbing the alignment of the electronic spins in a manner quantitatively related to the magnetic field strength, and quantitatively detecting the response of the electronic spins to the perturbation, whereby the magnetic field strength can be measured based on the detected response to the perturbation.

Measurement results may be provided on a readout and/or display apparatus whereby at least one of the presence, direction and strength of the magnetic field is displayed, preferably at a high spatial resolution across different locations within the magnetic field. Optionally, dynamic display in real time is provided for a variable magnetic field. Optionally, the display may present the data in two or three dimensions, or on a screen simulating two or three dimension to the viewer, corresponding to the desired nature and extent of measurement of the magnetic field.

For example, θ may be between about 45° and about 60°, for example between about 50° and about 57°, for example about 53° and about 56°, for example about 54° and about 55°.

In the most preferred embodiment, θ is the "magic angle" ($\theta_m$), which has a value of arccos $1/\sqrt{3}$ or arctan $\sqrt{2}$ (approximately 54.7°). At this preferred angle, the intrinsic interaction between spins in a line is minimised, preferably to essentially zero.

In another embodiment, θ is between about 50° and about 57°. Within this range of angles, the intrinsic interaction between spins is reduced to at most about 10% of its nominal value, that is the value that would be found in an with an analogous system in which no specific lining up of the spins at the angle θ has been performed, i.e. a random or uncontrolled arrangement.

In another embodiment, θ is between about 45° and about 60°. Within this range of angles, the intrinsic interaction between spins is reduced to at most about 25% of its nominal value, that is the value that would be found in an with an analogous system in which no specific lining up of the spins at the angle θ has been performed, i.e. a random or uncontrolled arrangement.

The electronic spins are preferably free from magnetic interference from the solid carrier. Adjacent groups of electronic spins are preferably free from magnetic interference from each other. The expression "free from magnetic interference" means that magnetic interference is ruled out or substantially reduced by the nature of the materials involved (typically, this will apply in the case of the solid carrier), and/or that special measures have been taken, for example by the selection of the separation distance between parts, the inclusion of materials that dampen magnetic interference, or combinations thereof, to rule out or substantially reduce the magnetic interference (typically, this will apply in the case of adjacent groups of electronic spins).

The invention allows much higher spin densities to be used than hitherto, as well as substantially enlarging the range of solid state electronic spin systems that can be used in magnetometers. This opens the possibility of providing highly miniaturised and/or essentially two-dimensional structures for highly sensitive detection of very low magnetic field strengths with high spatial resolution, optionally in two or three dimensions. For example, electronic spin systems with long intrinsic spin coherence times (for example, shallow donor electron spins in silicon), can in principle provide with the present invention high sensitivity magnetometers with the potential for the first time to detect and map magnetic fields with extremely high spatial resolution, for example to about 0.1 nm and even below that, and extremely high sensitivity, for example to about 1 attoTesla and even below that.

DETAILED DESCRIPTION

Solid State Electronic Spin Systems

Any solid state electronic spin system, including surface and body systems, known or to be developed, can be used in the implementation of the present disclosure.

Examples of suitable spin systems include molecular spin systems, spin systems based on defects or impurities in inorganic solids, and spin systems based on the electron spins of artificial atoms such as quantum dots.

Molecular Spin Systems

In molecular spin systems, the spin is typically localised on a metal ion surrounded by ligands, or delocalised with a region of an organic molecule. In both cases, the solvent environment around the molecule plays a critical role in determining the spin coherence time. Longer coherence times are generally provided by solvents which are essentially free of nuclear spins, such as carbon disulphide ($CS_2$). In particular, a molecular magnet having ligands that are nuclear-spin-free and are soluble in $CS_2$ allowed coherence times of 700 μs to be obtained in a 10K testing environment (as discussed in "Millisecond coherence time in a tuneable molecular electronic spin qubit" by Zadrozny, J. M. et al., ACS Centr. Sci 1 (9) (2015) 488-492, https://doi.org/10.1021/acscentsci.5b00338 the contents of which are incorporated herein by reference. Web links here and throughout valid as of 5 Mar. 2018.). Molecular spin system can be tethered onto surfaced in carefully defined regions using electron beam lithography patterning combined with organic linker molecules (see S. K. H. Lam et al., 2008 Nanotechnology 19 285303. https://doi.org/10.1088/0957-4484/19/28/285303 the contents of which are incorporated herein by reference.).

Spin Systems Based on Defects or Impurities in Inorganic Solids

In these spin systems the solid carrier is an inorganic solid, preferably isotopically pure (having lower than natural abundances of undesired isotope(s), for example: carbon containing less than 1.1% of $^{13}C$, or silicon containing less than 5% of $^{29}Si$). The spin systems should preferably contain fewer than about 50 ppm of undesired isotopes). Defects or impurities are artificially added to the carrier to generate the spin system. The spins are typically located, and preferably locked in position, in or on the solid carrier.

Spin systems can be based on various solid carriers; suitable substrates include silicon, carbon, silicon carbide or zinc oxide. The carbon may be present in an essentially 2-dimensional system of carbon such as graphene. The silicon, carbon or silicon carbide is preferably isotopically enriched such that the $^{28}Si$ and/or $^{12}C$ isotopes predominate, with all other isotopes present in amounts less than natural abundance levels. Zinc oxide is isotopically enriched to reduce the $^{67}$Zn fraction well below natural abundance levels (4%). The performance of the systems can be optimised by minimising levels of undesired isotopes.

Defect sites which provide electronic spin systems can be provided in silicon by doping with donors, for example Group V elements such as P, As, Sb or Bi, or Group VI elements which are singly ionised such as Se+ Doping using As donors is discussed in greater detail in Spin relaxation and donor-acceptor recombination of Se+ in 28-silicon, R. Lo Nardo et al., Phys Rev B 92 165201 (2015), and doping using Se+ donors is discussed in greater detail in Stark shift and field ionization of arsenic donors in 28Si-silicon-on-insulator structures, C. C. Lo et al., App Phys Lett 104 193602 (2014), the contents of both documents being incorporated herein by reference.

The silicon used in defect/impurity based spin systems is preferably predominantly $^{28}$Si formed by isotopic enrichment, with a remaining $^{29}$Si concentration down to 50 ppm. Using Group V donors and cooling below about 50K, electrons become bound to the donor atom, with an isotropic hyperfine coupling to the donor nucleus. The electron spins of such donors have coherence times which are limited to several hundreds of microseconds in natural abundance silicon (5% $^{29}$Si), but can reach tens of milliseconds in $^{28}$Si with $[P]=10^{14}$ cm$^{-3}$, limited only by instantaneous diffusion caused by the finite concentration of donor electron spins (see, for example, Tyryshkin et al, "Coherence of spin qubits in silicon", J. Phys.: Condens. Matter, 18 (21), (2006), S783 (URL: http://stacks.iop.org/0953-8984/18/i=21/a=S06); George et al, "Electron spin coherence and electron nuclear double resonance of Bi donors in natural Si", Phys. Rev. Lett. 105 (2010) 067601 (URL: https://doi.org/10.1103/PhysRevLett.105.067601); and Tyryshikin et al, "Electron spin coherence exceeding seconds in high-purity silicon", Nat. Mater. 11(2) (2011), 143-147 (URL: http://www.ncbi.nlm.nih.gov/pubmed/22138791), the contents of all of which are incorporated herein by reference.

Defect sites which provide electronic spin systems can be provided in carbon using NV centres in single diamond nanocrystals, such as described in U.S. Pat. No. 8,947,080 (Lukin et al) and US Patent Application No. 2010/0315079 (Lukin et al, see also Jelezko et al, "Observation of coherent oscillations in a single electron spin", Phys. Rev. Lett., 92(7) (2004), 1-4 (URL: http://link.aps.org/doi/10.1103/PhysRevLett.92.076401)). The large Debye temperature of diamond, coupled with the mainly nuclear-spin-free carbon environment, leads to electron spin coherence times of several hundred microseconds at room temperature, extendible to a few milliseconds using decoupling via the CPMG (Carre-Purcell-Meiboom-Gill) periodic pulse sequence (see Bar-Gill et al, "Solid-state electronic spin coherence time approaching one second", Nat. Commun. 4 (2013), 1743 (URL: http://www.ncbi.nlm.nih.gov/pubmed/23612284) or by using $^{12}$C-enriched diamond (Balasubramanian et al, "Ultralong spin coherence time in isotopically engineered diamond", Nat. Mater. 8 (2009), 383-387). Alternatively, silicon vacancy (SiV$^{-1}$) (S=½; T$_2$ approximately 100 ns at 3.6 K) or germanium vacancy (GeV$^{-1}$) (T*$_2$ approximately 20 ns at 2.2 K) defects can be introduced into single diamond nanocrystals to provide spin systems The use of the negatively charged silicon vacancy defects in carbon is described in Pingault et al, "Coherent control of the silicon-vacancy spin in diamond", Nat. Commun. 8 (2017), 15579 and Rogers et al, "All-optical initialization, readout, and coherent preparation of single silicon-vacancy spins in diamond", Phys. Rev. Lett. 113 (2014), 263602 (URL: https://link.aps.org/doi/10.1103/PhysRevLett.113.263602). The use of the negatively charged germanium vacancy defects in carbon is described in Siyushev et al, "optical and microwave control of germanium-vacancy centre spins in diamond", Phys. Rev. B 96, 081201 (2017) (https://journals.aps.org/prb/abstract/10.1103/PhysRevB.96.081201) and Bhaskar et al, "Quantum nonlinear optics with a germanium-vacancy color centre in a nanoscale diamond waveguide", Phys. Rev. Lett. 118 (2017), 223603 (URL: https://link.aps.org/doi/10.1103/PhysRevLett.118.223603). The neutral SiV$^0$ centre (S=1, in contrast, has T$_2$ approximately 1 ms at 20 K, while still retaining most (90%) of its optical emission in the zero phonon line, a combination which makes it very promising (see Rose, et al, "Observation of an environmentally insensitive solid state spin defect in diamond" (https://arxiv.org/abs/1706.01555). For sensing, nanodiamonds are also used but they have much shorter coherence times as shown by Knowles et al, "Observing bulk diamond spin coherence in high-purity nanodiamonds", Nat. Mat. 13, 2 21-25 (2014) (https://www.nature.com/articles/nmat3805). Spins near the surface of the diamond can be closer to the magnetic field to sense, but they are harder to fabricate and have coherence time strongly affected by the surface, as studied by de Oliveira et al, "Tailoring spin defects in diamond by lattice charging", Nat. Comm. 8, 15409 (2017) (https://www.nature.com/artides/ncomms15409). The contents of all the references identified above in this paragraph are incorporated herein by reference.

Defect sites which provide electronic spin systems can be provided in silicon carbide, another host offering a largely nuclear-spin-free environment (see Seo et al, "Quantum decoherence dynamics of divacancy spins in silicon carbide", Nat. Commun. 7 (2016) 12935 (https://www.nature.com/ncomms/2016/160929/ncomms12935/full/ncomms12935.html) Suitable defects include neutral divacancies in 4H-SiC, for example neutral divacancies established by irradiation with 2 MeV electrons at a range of fluences from about $5\times10^{12}$ cm$^{-2}$ to about $1\times10^{15}$ cm$^{-2}$ to create Si and C vacancies, followed by annealing to activate vacancy migration. See, for example, Christle et al "Isolated electron spins in silicon carbide with millisecond coherence times (available on-line at https://arxiv.org/ftp/arxiv/papers/1406/1406.7325.pdf); Falk et al, "Polytype control of spin qubits in silicon carbide", Nat. Commun. 4, 1819 (2013); and Carlos et al, "Annealing of multivacancy defects in 4H-SiC", Phys. Rev. B 74, 235201 (2006), the contents of all of which are incorporated herein by reference.

Defect sites can also be provided by rare earth dopants in crystal hosts, such as yttrium orthosilicate (YSO) and YLiF$_4$. Spin coherence times of in excess of one second have been observed in erbium (Er) doped YSO when subjected to both high magnetic fields (such as 7T) and low temperatures (1.4K), said conditions being required to suppress electron spin dynamics.

Electron spins can also be confined in quantum dot structures, for example in metal-oxide-semiconductor (MOS) structures and Si/SiGe heterostructures. The coherence lifetimes of such systems can reach 28 ms under dynamical decoupling (as discussed in "An addressable quantum dot qubit with fault-tolerant control-fidelity", M. Veldhorst et al., Nature Nanotechnology 9, 981-985 (2014), doi:10.1038/nnano.2014.216 incorporated herein by reference) and using $^{28}$Si. Though not as long a coherence time as the longest times of atomic defect spins in solids, quantum dots have the advantages of highly controlled placement accuracy through fabrication methods and well developed read-out schemes, as discussed below.

The electron spin systems may be used at cryogenic temperatures, for example less than about 100 K, in order to provide preferable spin coherence time. The temperatures required to provide suitable coherence times in a given system are dependent primarily upon the solid carrier used in the system. For example, Si based systems are typically operated at temperatures less than about 10K, while systems based on C or SiC or molecular electron spins can have effective operational temperatures ranging from less than about 1K to room temperature. Quantum dot spins are typically measured at temperatures below 1K. As such, the operational temperature is set based on the particular coherence requirements of each system.

Alignment/Polarisation

Any suitable spin alignment stimulus can be applied a solid state electronic spin system in accordance with the present disclosure. An example of a suitable alignment stimulus utilises an applied external magnetic field. In the example alignment mechanism, the spins are first polarised using an applied external magnetic field. The external magnetic field may be generated by driving a set current through coils in a Helmholtz arrangement, or using a permanent magnet (such as Fe or Co or rare-earth-based compound) in the vicinity of the sample, or using the Earth's magnetic field.

Alternatively or additionally, some systems may be polarised using incident electromagnetic radiation. That is, some systems can be optically polarised by applying optical illumination incident of the spins at a precise wavelength (and therefore energy) suitable for absorption by the spin. In some instances, the spin is polarized optically via a spin-dependent intersystem crossing. For negatively charged nitrogen vacancy (NV) centres in diamond, the illumination wavelength used for spin polarisation may be in the visible region, for example using a wavelength of 532 nm. In negatively charged silicon vacancies, the excitation wavelength may be at higher wavelength, for example between 700 nm and 920 nm (Baranov, P. G. et al. Silicon vacancy in SiC as a promising quantum system for single-defect and single-photon spectroscopy. Phys. Rev. B 83, 125203 (2011)). In neutral divacancies in silicon carbide, the wavelength may be in the near-infrared, for example between 800 and 1150 nm (Koehl, W. F., et. al. Room temperature coherent control of defect spin qubits in silicon carbide. Nature 479, 84-87 (2011)). Donor spins in silicon may be optically polarised using donor-bound exciton transitions around 1078-1080 nm (Lo et al, Nature Materials 14 490 (2015)). The contents of all the references identified above in this paragraph are incorporated herein by reference Spin Alignment Detection Devices and Field Detection In order to obtain the magnetic field, the alignment of the spins is detected using a suitable alignment detection device. From the detected spin alignment the presence (and direction) of the magnetic field is deduced.

To detect their state, the spins may be manipulated using a microwave or radiofrequency pulse of precise frequency, phase and duration in order to convert the states which have evolved as a result of a magnetic field to which the spins are subjected into states which are readily distinguishable by measurement.

For optically-active defects in the solid state, such as nitrogen vacancy centres in diamond, silicon vacancy centres in diamond, silicon vacancies in silicon carbide or divacancies in silicon carbide, the spin alignment may be measured for example via spin-dependent photoluminescence. In this process, the photoluminescence after excitation by a laser source depends on the alignment of the spin in the ground or excited state due to an inter-system crossing. The methods for polarization (as discussed above) and measurement are very similar in this case, in particular the methods typically include the application of electromagnetic radiation of the same wavelength. For nitrogen vacancy centres in diamond, the illumination wavelength may be for example 532 nm and the centres emit light from about 600 to 800 nm. For divacancies in silicon carbide, the illumination wavelength may be for example 975 nm and the centres emit light from about 1050 to 1200 nm.

Donor electron spins in silicon and quantum dot spins can be read through a process of spin-to-charge conversion. This can be achieved by spin-dependent donor or dot ionisation through tunnelling of the donor or dot electron to an electron reservoir in a silicon nanodevice, caused by the difference in the spin-up and spin-down energy levels in a magnetic field (Elzerman et al, Nature 430, pages 431-435 (22 Jul. 2004)). The change in the donor or dot charge state is detected by a single electron transistor, to yield the state of the donor or dot spin (spin-up or spin-down, i.e. aligned with or against the external magnetic field) (Pla et al. Nature 489 541-545 (2012)). Spin-dependent donor or dot isolation typically requires very low temperatures and large magnetic fields to work effectively (e.g. 3 Tesla and 100 mK).

An alternative strategy for spin-to-charge conversion for donors in silicon, which is less temperature and magnetic field dependent and can work down to zero magnetic field and temperatures of up to 10K, is based on the spin-selective generation of donor-bound excitons, a method demonstrated for example in Lo et al, Nature Materials 14 490 (2015). Here the donor-bound exciton is optically generated using a laser pulse, in a manner which depends on the spin-state of the donor. The donor-bound exciton then decays by Auger recombination, ionising the donor. The resulting donor ionisation can be detected using methods incorporating a single electron transistor, or by RF gate reflectometry, or by the generated photocurrent or some other change in the complex impedance of the device, as would be understood by those skilled in the art. The contents of all the references identified above in this paragraph are incorporated herein by reference Spin Alignment Perturbation Devices and Field Strength Measurement In order to quantify the external magnetic field a perturbation, the effect of which is quantitatively related to the magnetic field strength, may be applied to the aligned spins.

After alignment/polarisation, the spins may be given some form of further stimulus, for example using a microwave or radiofrequency pulse of precise frequency, phase and duration, to excite them into a particular quantum state which will evolve, for example picking up phase, as a result of the magnetic field to be sensed. After alignment/polarisation, the spins may also be continuously driven by, for example, a microwave or radiofrequency excitation in order to measure the resonance frequency of the spins. This resonance frequency may be sensitive to the external magnetic field to be sensed. The sensing is realized by detecting changes in the resonance frequency.

In one embodiment, the spins are rotated by the ESR (electron spin resonance) field or radio frequency (RF) radiation into the x-y plane (i.e. a plane perpendicular to the initial spin alignment direction), and then the external magnetic field to be measured causes the spins to precess about the direction of the magnetic field.

The spins may be manipulated further during the sensing period in order to make them sensitive only to time-varying (AC) magnetic fields of particular frequency.

The perturbation of aligned spins in aspects of embodiments may be performed using any of the methods discussed above. In particular, these methods are suitable for use with: molecular spin systems; spin systems of silicon provided with Group V donors providing an electronic spin; spin systems of carbon provided with NV centres, negative silicon vacancies, neutral silicon vacancies or germanium vacancies; and spin systems of silicon carbide provided with neutral divacancies providing an electronic spin.

Embodiments of the Arrangements of Electronic Spins into Groups and the Angulation Thereof Localised spins are formed in arrays with specific geometries, which can be created using established micro-fabrication processes. Typically the sensitivity of spin based magnetometers depends on the number of spins in each pixel, or sensing element, with the sensitivity being approximately proportional to the square root of the number of spins (N) (therefore $\sim N^{1/2}$). The sensitivity is also approximately proportional to the square root of the spin coherence time of each spin ($\sim\sqrt{T_2}$). Typically increasing the number of spins (N) results in a reduced $T_2$, due to the increased magnetic dipolar interaction between the spins.

In aspects of embodiments of the present disclosure, the spins are provided as one or more groups each containing a plurality of spins, the spins of a group being present in a substantially straight line which is angled at an angle θ with respect to the local direction of the magnetic field at the group.

The spins may be arranged in a single line, also referred to as a stripe or a chain. However, in aspects of embodiments of the disclosure, the number of spins may be further increased by providing a plurality of lines (also referred to as stripes or chains) of spins. A magnetometer may comprise multiple pixels or sensing elements, each of which comprises one or more lines (stripes, chains) of spins. These stripes may, for example, be arranged substantially parallel to each other in each pixel and/or in the overall pixel array of the magnetometer. The lateral spacing between each stripe (also referred to as the inter-chain separation) is preferably selected to be sufficiently large such that the interactions between dipoles in adjacent stripes is negligibly small. The lateral spacing between stripes, and also the intra-chain spacing between spins, is dependent upon the specific configuration of the system, for example, the nature of the spins, a type of solid carrier or solvent that is used, and so on. Typical lateral spacings are of the order of 750 nm. By way of example, intra-chain spacings between spins can typically be of the order of 10 to 100 nm.

Data Output and Display Devices

In accordance with the present disclosure, an array of spins may be fabricated to form the pixels of a magnetometer, for example as a silicon based semiconductor device in the manner of known CCD (Charge Coupled Device) or active pixel sensor (APS) arrays. The localised spin states are detected by a hybrid optical-electrical detection method, where photons at a particular wavelength are used to excite the localised spin states, creating free charges that can be captured. The resulting transient current/charge accumulation is detected by integrated on-chip electronics.

The magnetometer may include apparatus for recording and/or displaying the data output. Electrical and electronic means may be provided such that the raw data output may be saved for later processing, or may be processed immediately, to determine properties of the magnetic field. Properties of the field to be determined may include, for example, the field presence, field strength and/or field direction. The data may be recorded at a high spatial resolution and may be an instantaneous measurement, or recorded over a period of time, or a series of individual measurements may be taken over a period of time to provide details of how the field changes with time. Such data may be saved within the apparatus or on any suitable recording medium, for example a hard disk drive, random access memory (RAM), optical disk or disks, and so on. The data may be saved locally and/or may be transmitted over a suitable network, such as the internet, for remote storage or processing.

Alternatively, or in addition to the above, the magnetometer may present measurements to a user in real time, or in near real time (for example, real time plus a constant delay).

The magnetometer may comprise a display device. A dynamic display in real time may be provided for a variable magnetic field. The display may present the data in two or three dimensions, or on a screen simulating two or three dimension to the viewer, corresponding to the desired nature and extent of measurement of the magnetic field.

Sensitivity and Spatial Resolution

A magnetometer as described herein may provide a sensitivity of around 1 pT/Hz$^{-1/2}$ for a pixel area of 30×30 μm$^2$. The sensitivity provided by any given magnetometer in accordance with the present disclosure is determined primarily by the square root of the area of the sensor, such that a pixel area of 100×100 μm$^2$ may provide a sensitivity of around 300 fT/Hz$^{-1/2}$.

In some aspects of embodiments the sensing area of the magnetometer may be as small as 10×10 μm$^2$. By way of comparison, a known SQUID (Superconducting QUantum Interference Device) sensor with a 30×30 μm$^2$ area has a sensitivity of around 2 pT/Hz$^{-1/2}$. However the sensitivity of a SQUID sensor scales linearly with area. Therefore, aspects of embodiments of the present invention provide magnetometers that may perform substantially better than SQUID sensors of equivalent sensing areas, especially but not exclusively for small sensor areas such as, for example areas smaller than 30×30 μm$^2$.

Manufacture/Fabrication of the Magnetometer and Spin Systems

Donor spins may be created in semiconductors, such as silicon, using methods such as scanning tunnelling microscopy (STM) based lithography, as known to those skilled in the art. Use of suitable manufacturing methods can provide atomic precision accuracy in the placement of individual spins. Suitable methods are known to those skilled in the art.

The creation of the spin arrays requires confinement of the doping profile in two dimensions. This may be achieved for example using one-dimensional materials such as nanowires or nanopillars (Babinec, T. M. et. al. A diamond nanowire single-photon source, Nature Nanotechnology 5, 195-199 (2010)). This may also be achieved by combination of two separate techniques for each dimension of confinement. Depth confinement may be created for example by delta-doping techniques where a single layer of material with dopants or defects is created (Ohno, K. et. al. Engineering shallow spins in diamond with nitrogen delta-doping. Appl. Phys. Lett. 101, 082413 (2012)). Lateral confinement may be realized for example using nanofabrication technique such as etching or implantation through a patterned mask, written by electron-beam or optical lithography. Lateral confinement may also be generated by selective ionization using metallic gates or other methods. The present invention may be insensitive to small misalignment of spins in the arrays. The misalignment must be a fraction of the inter-spin spacing within an array which may be defined by the spin concentration. Quantum dot spins for example MOS or Si/SiGe are confined using patterned metal gates and hence linear arrays can be produced simply by repeating the structure which forms the quantum dot along one dimension. Using typical gate pitches and current fabrication technology, intra-chain spacings of 20-30 nm are possible, and smaller spacings can be expected from further development of advanced fabrication methods. The contents of all the references identified above in this paragraph are incorporated herein by reference

BRIEF DESCRIPTION OF THE DRAWINGS

Example embodiments of the present invention are now described, by way of example only, with reference to the accompanying Figures in which.

DETAILED DESCRIPTION OF THE DRAWINGS

Figure 1A:
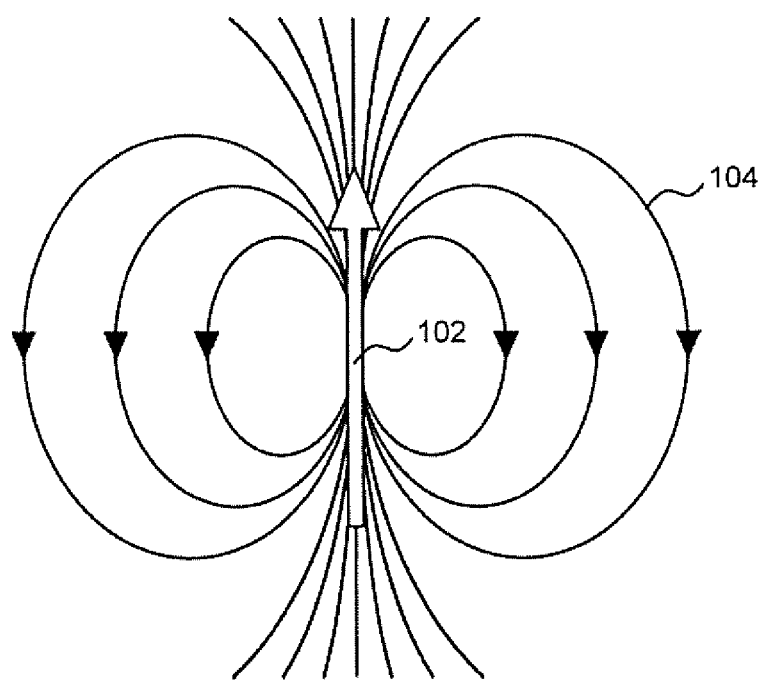
FIG. 1A is an example of the magnetic field due to a magnetic dipole.

FIG. 1A shows a magnetic dipole 102, and the corresponding magnetic field lines 104. With the dipole aligned in the 'z' direction, the field strength is given by the equation:

$$\vec{B} = |\mu|/r^3 (3 \sin\theta \cos\theta(\cos\phi \hat{x} + \sin\phi \hat{y}) + (3\cos^2\theta - 1)\hat{z})$$

where $\mu$ is the magnetic dipole moment, (r, $\theta$, $\phi$) are polar coordinates.

Figure 1B:
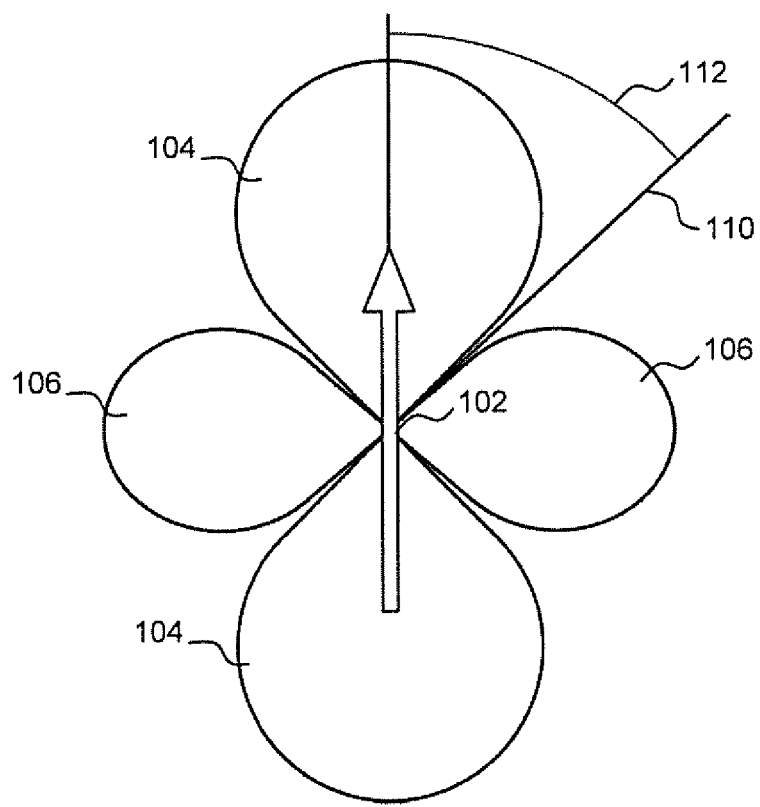
FIG. 1B is an example of a magnetic dipole showing the "magic angle"

FIG. 1B also shows a magnetic dipole 102 orientated in the 'z' direction, and shows regions in which the 'z' component of the magnetic field, $B_z$, are positive 104 and regions in which $B_z$ is negative 106. There exists a line 110 between these regions, along which $B_z$ is zero. The angle formed between this line and the direction of orientation of the dipole 102 is known as the "magic angle", and it has a value of $\theta = \arccos 1/\sqrt{3} \approx 54.7°$ as described previously.

Figure 2A:
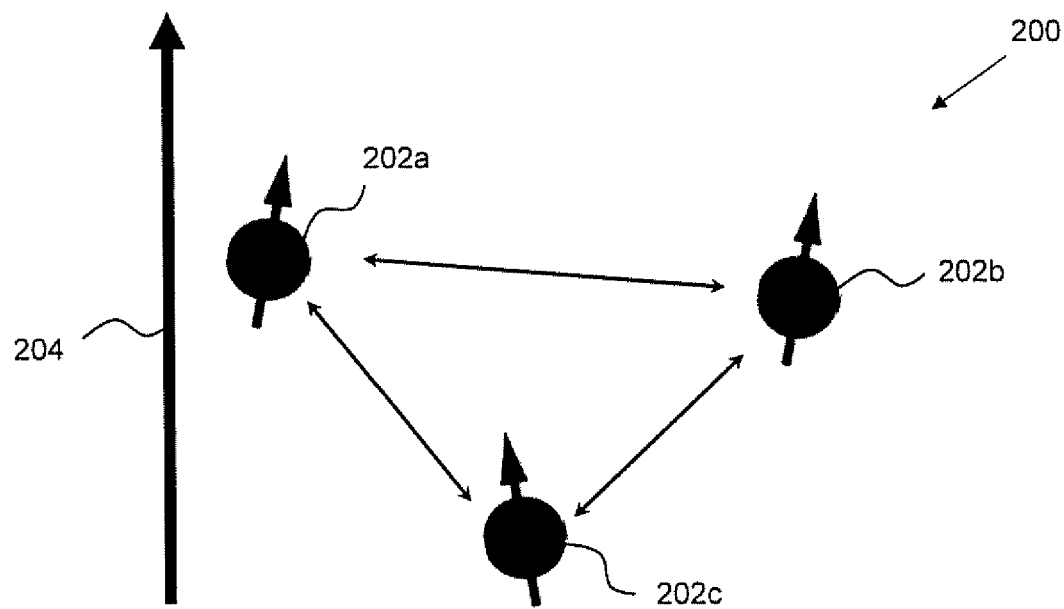
FIGS. 2A-2B are examples of electronic spin systems, FIG. 2A not according to the present invention and FIG. 2B according to the present invention.

FIG. 2A shows a known solid state electronic spin system 200 comprising a plurality of electronic spins 202a, 202b, 202c generally aligned with a magnetic field 204. The electronic spins are positioned randomly within a solid carrier. Due to the random angles between the positions of the magnetic dipoles of the spins 202a, 202b, 202c, there exists a magnetic dipolar interaction between the electronic spins 202a, 202b, 202c. This dipolar interaction reduces the spin coherence time $T_2$ of each spin 202a, 202b, 202c.

Figure 2B:
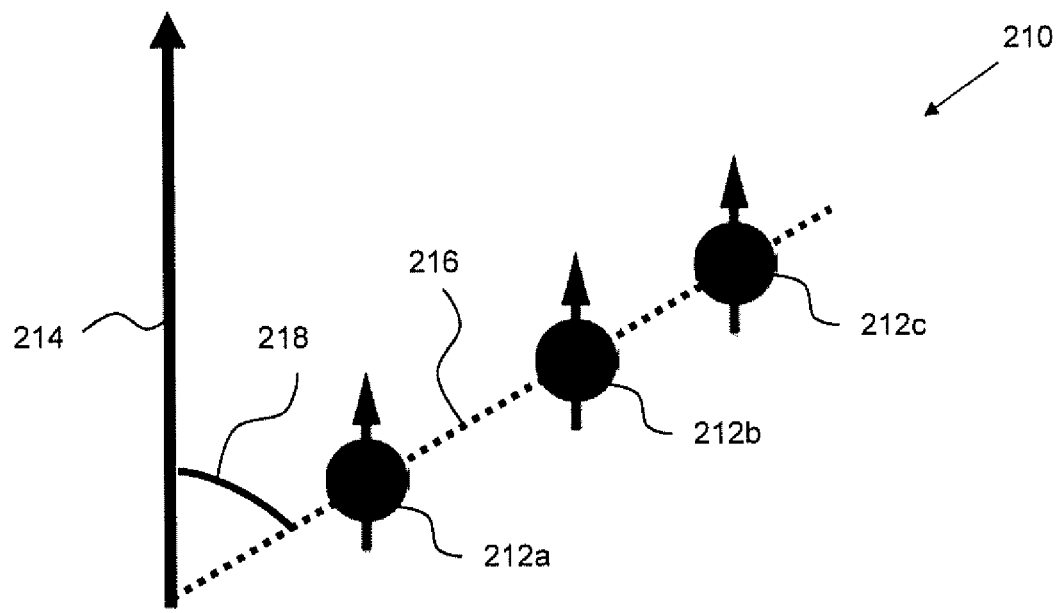

FIG. 2B shows a solid state electronic spin system 210, according to the present disclosure, comprising a plurality of electron spins 212a, 212b, 212c generally aligned with a magnetic field 214. In this system 210 the electronic spins 212a, 212b, 212c are not randomly arranged as in FIG. 2A, but instead are arranged along a substantially straight line 216. Typically a line will include a plurality of spins, generally 3 or more spins, and may contain at least one hundred, several hundred or several thousand spins.

The line 216 forms an angle $\theta$ (218) with the magnetic field 214, the value of the angle $\theta$ being approximately equal to the 'magic angle' described in relation to FIG. 1. It has been established that at this magic angle there is little or no unwanted dipolar interaction between the spins 212a, 212b, 212c and so the spins in the electronic spin system 210 shown in FIG. 2B have a surprisingly long spin coherence time relative to the spin coherence time of a randomly or uncontrolledly arranged electronic spin system 200, such as the system shown in FIG. 2A. It is not essential for the line of spins to be provided at exactly the magic angle with respect to the magnetic field 214; a larger range of angles may be used without negating the increase in coherence time provided by the arrangement of the spins. Although the exact range of angles which may be used without negating the increased coherence time benefits is dependent on the specific system configuration, typical range of angles which provide substantial increases in coherence times relative to unarranged spin systems are between about 45° and about 60°. Preferably, the angle is between about 50° and about 57°, more preferably between about 53° and about 56°, even more preferably between about 54° and about 55°. The closer the angle is to the magic angle (54.7°), the more pronounced the coherence time benefits provided are. As stated above, for spins with S>½ under the influence of some crystal field, the optimum angle differs from 54.7° and should be set accordingly.

Figure 3A:
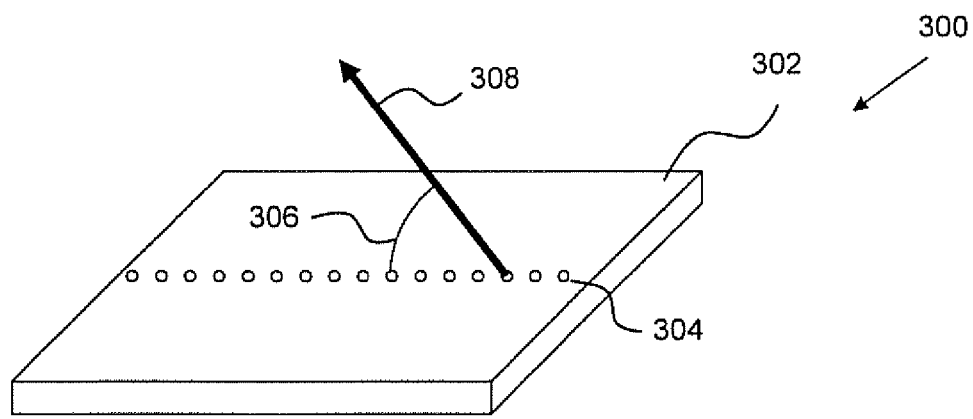
FIGS. 3A-3B are examples of a pixel of a magnetometer.

FIG. 3A shows a pixel of a magnetometer 300 in accordance with an aspect of an embodiment. The magnetometer pixel 300 comprises a solid carrier 302. The solid carrier may be formed from, for example, a semiconducting material such as silicon. Within the solid carrier 302 there are a plurality of electronic spins 304. The plurality of electronic spins 304 are arranged using any suitable method in a line as described in relation to FIG. 2B. The orientation of the line of spins 304 is such that it forms an angle 306 with the magnetic field to be measured 308. As described previously, the angle 306 is be selected so that it is the angle $\theta$ in accordance with the present invention, namely at or near the "magic angle".

Figure 3B:
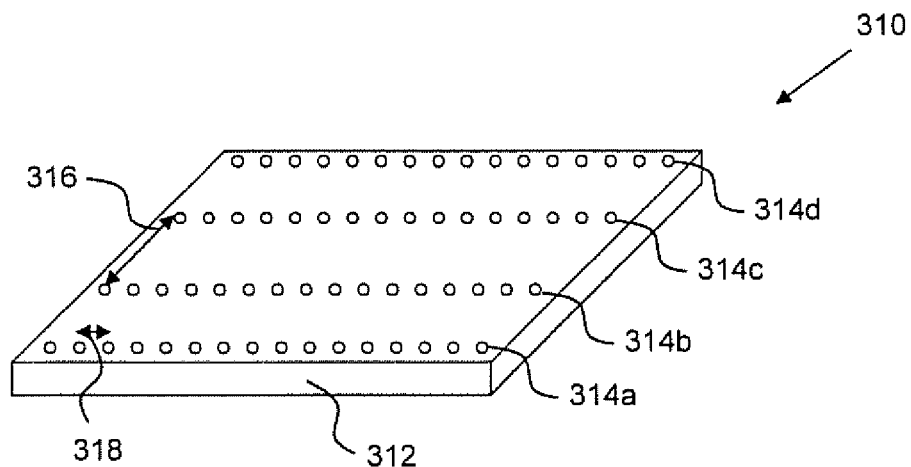

FIG. 3B shows a pixel of a magnetometer 310 in accordance with a further aspect of an embodiment. The magnetometer pixel 310 also comprises a solid carrier 312 and a plurality of electronic spins 314. However the electronic spins are arranged in several lines 314a, 314b, 314c, 314d rather than in a single line. This allows more electronic spins to be provided within the magnetometer pixel. The spacing 316 between the lines of electronic spins is selected that it is sufficiently large that there is no significant interaction between the spins in adjacent lines, that is, any interaction between spins in adjacent lines does not negate the increase in spin coherence time of the system provided by aligning the electron spins in lines. An example of a suitable spacing between lines is 750 nm, although this value is dependent upon the specific configuration of the system.

The spacing 318 between of the spins within a given line may, however, be substantially smaller than the lateral spacing 316 between lines, without negatively impacting upon the spin coherence time. Typical examples of intra-line spin spacings are between 10 and 100 nm, although again the exact value is dependent upon the specific system configuration. The relatively close proximity of the spins within a line is acceptable because the spins within the line do not mutually interfere to an extent sufficiently large to overcome positive effects on the spin coherence time; preferably the spins within a line are arranged at or near the angle θ with respect to the local direction 308 of the magnetic field.

Figure 4A:
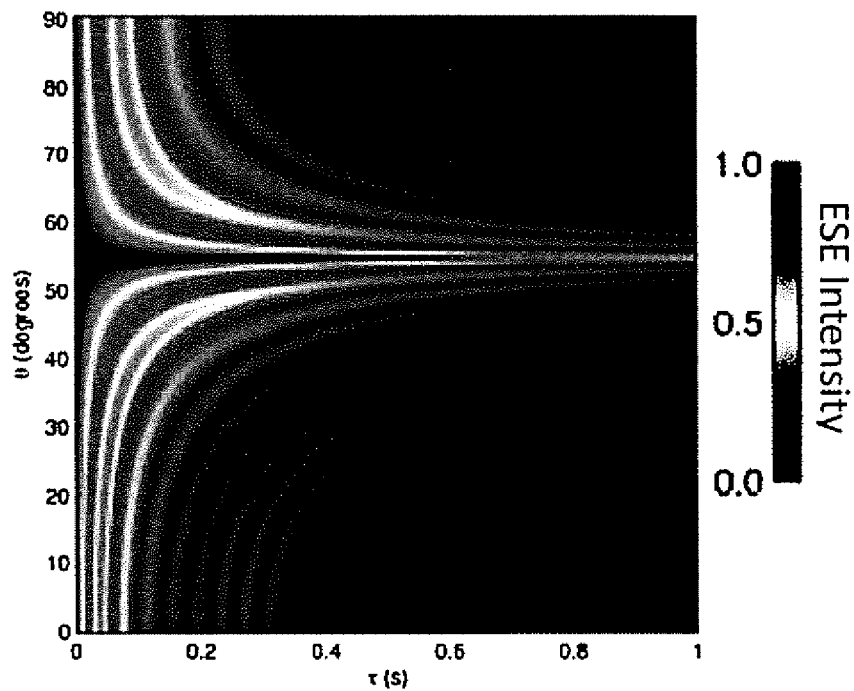
FIGS. 4A-4B show simulations of spin coherence time for the magnetometers in FIGS. 3A-3B.
Figure 4B:
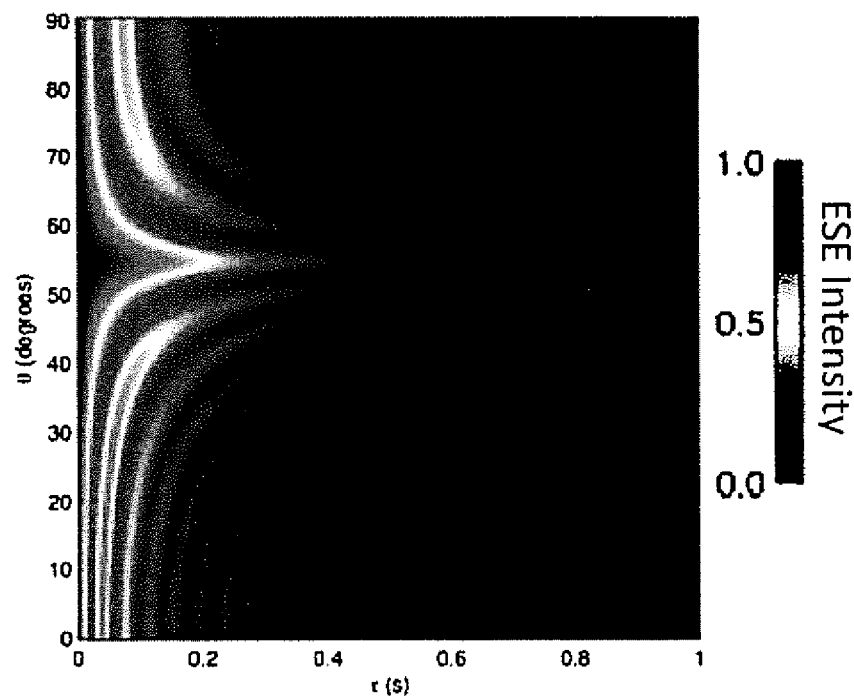

FIGS. 4A and 4B show the simulated Electron Spin Echo (ESE) for the magnetometers shown in FIGS. 3A and 3B, respectively. The vertical axis of the figures represents the angle θ between the line of electronic spins and the applied external magnetic field. The horizontal axis represents spin coherence time τ. FIG. 4A shows the ESE intensity for the magnetometer with a single line of electronic spins, and shows a peak in the ESE intensity around the angle of 54.7°. As discussed above, 54.7° is the angle at which a reduced interaction between electronic spins is observed; the "magic angle".

FIG. 4B shows a similar plot to that shown in FIG. 4A, save that the magnetometer to which the ESE shown in FIG. 4B relates comprises a plurality of parallel lines of electronic spins (as shown in FIG. 3B). A peak in ESE intensity can also be seen around the "magic angle", however this peak is less intense than that of FIG. 4A, due to the magnetic dipole interactions between spins in adjacent lines. Despite the magnetic dipole interactions between spins in adjacent lines, the spin coherence time of the magnetometer is substantially longer than would be the case for a magnetometer having randomly arranged electron spins.

Figure 5:
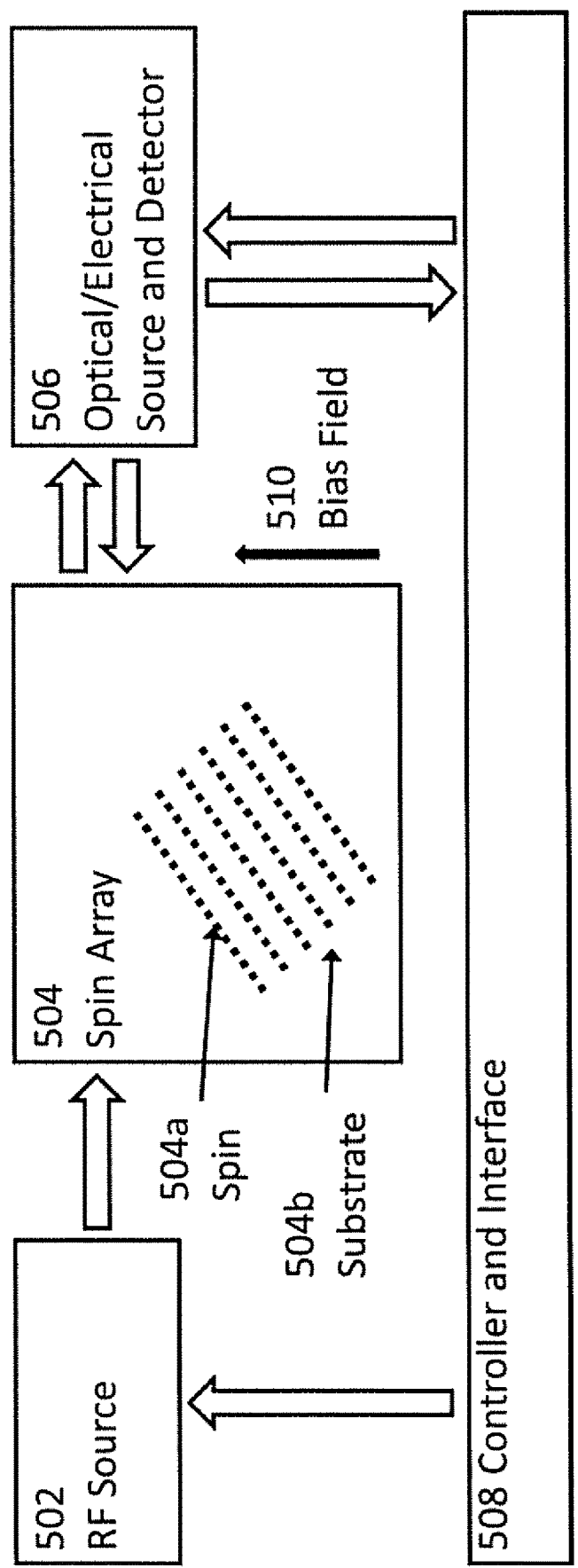
FIG. 5 is a schematic diagram showing a magnetometer system in accordance with an aspect of an embodiment.

FIG. 5 is a schematic diagram showing a magnetometer system in accordance with an aspect of an embodiment. For simplicity, the magnetometer shown in FIG. 5 shows a single pixel comprising an array of spins 504; typically a magnetometer would comprise a plurality of such pixels. The spin array 504 of FIG. 5 comprises a plurality of spins 504a supported by a substrate 504b solid carrier. Typically, the spins 504a are locked in position with respect to one another in or on the solid carrier, and the magnetometer comprises means for moving the plurality of spins 504a collectively with respect to the local magnetic field. Alternatively, and depending on the specific configuration and purpose of the magnetometer, a local magnetic field source may be moved with respect to the plurality of spins 504a. In a further aspect of an embodiment, wherein the spins are confined in quantum dot structures, the respective positions of the spins relative to one another (and a local magnetic field) may be varied by manipulating gate potentials. In this further aspect, the relative spin positions may be manipulated using gate potential variations.

The orientation axis of the spins may be determined by an externally applied magnetic field "bias field" 510 or other properties of the spin, such as in internal crystal field. Where optical hyperpolarisation is used, this is provided from an optical source 506 such as a laser. The spins are subjected to an alignment stimulus such as an electromagnetic wave pulse from an RF source 502 (typically a microwave or radio frequency pulse, although pulses from other regions of the electromagnetic spectrum may also be used, as can continuous wave excitation) of precise frequency, phase and duration in order to convert the states which have evolved as a result of an additional magnetic field (on top of the bias field) to which the spins are subjected into states which are readily distinguishable by measurement. The properties of the electromagnetic wave pulse used (that is, the frequency, phase, duration, etc.) are selected according to the nature of the spin array 504. Following the application of the alignment stimulus by the source and detector 506, the alignment response of the spins is detected by the detector 506, which may include electrical and/or optical source elements. As such, both the presence and direction (or just the presence) of a magnetic field may be detected. The spins may photoluminesce following excitation by the optical source in 506, in which case optical detector in 506 may use photomultiplier tubes, photodiodes or similar to detect the emitted photons. Additionally or alternatively, the spins may be ionised (for example, using optical frequency light). A subsequent change in charge state or electron emission due to the ionisation may then be detected using an electrical detector 506. The response of the spin array 504 to the perturbation stimulus from the RF source 502 can be used to quantify the properties of the spin array in greater detail. In particular, the strength of the magnetic field may be determined based on an analysis of the response to the perturbation stimulus.

The source and detector 506 is connected to a controller and interface 508. This is responsible for triggering the initial alignment stimulus, and receiving the detector readout from the source and detector 506. The controller and interface 508 is typically linked to further components (not shown), such as a display unit or readout for indicating the results of the measurement, and/or a memory unit that may be used to store the results for future analysis. Optionally, the controller and interface 508 may be connected to a network (such as a LAN or the Internet) such that the results of the measurement may be distributed for interpretation at a local or remote site.

Similarly to the source and detector 506, the RF source 502 is connected to a controller and interface 508. Where a pulsed source 502 is used, the controller and interface 508 is responsible for triggering the pulse emission. Where a CW source 502 is used, this triggering is not necessary. The response of the spin array 504 to the perturbation stimulus is detected by the source and detector 506, and the detection results are then passed to the controller and interface 508. As in the case of the initial alignment stimulus results, a display unit may be used for indicating the results of the measurement, and/or a memory unit may be used to store the results for future analysis. Where the controller and interface 508 is connected to a network (such as a LAN or the Internet), this may be used to distribute results for interpretation at a local or remote site. The calculation of the magnetic field properties (such as presence, optionally direction, optionally strength, and so on) may be calculated at the controller and interface, or alternatively the raw results may be transmitted as discussed above such that the magnetic field properties can be calculated elsewhere.

Figure 6:
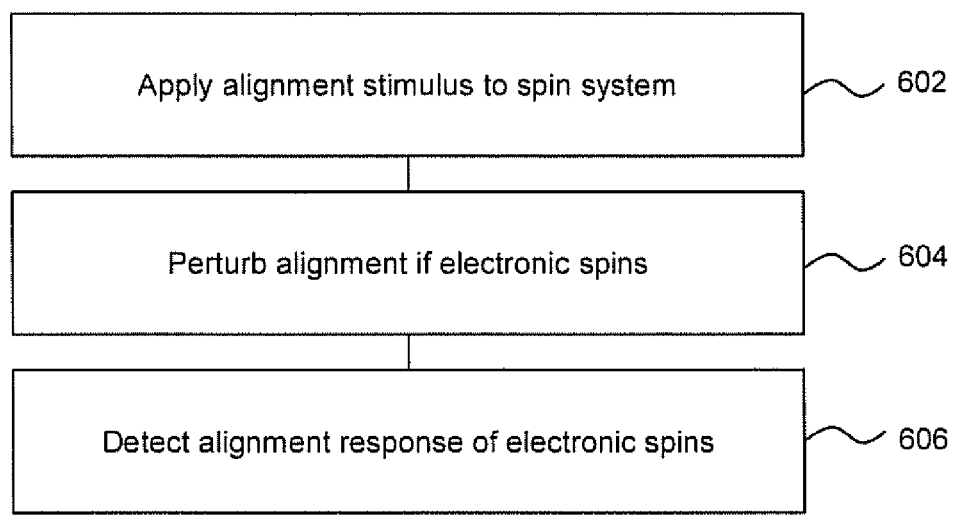
FIG. 6 is a flow diagram showing an example of a method of detecting a magnetic field.

FIG. 6 shows a flowchart of a method of detecting a magnetic field according to an aspect of an embodiment. The method may be executed using a suitable magnetometer, such as the magnetometer shown schematically in FIG. 5. As illustrated in block 602, the method comprises applying an alignment stimulus to a solid state electronic spin system containing a plurality of electronic spins and a solid carrier. The application of the alignment stimulus (as discussed) results in the alignment of the electronic spins with the magnetic field. The electronic spins are provided in the solid state electronic spin system as one or more groups each containing a plurality of spins, the spins of a group being present in a line which is angled at an angle θ with respect to the local direction of the magnetic field at the said group. As discussed above, θ is an angle at which the intrinsic interaction between the spins is sufficiently reduced, in comparison with an analogous system in which no specific or deliberate arrangement of the spins at the angle θ has been performed. The method allows the magnetic field to be detected, and optionally its strength measured, at a desired sensitivity and spatial resolution.

In block 604 the method optionally comprises perturbing the alignment of the electronic spins in a manner quantitatively related to magnetic field strength. In block 606 the method comprises detecting said alignment response of the electronic spins and optionally said perturbation of the said alignment, thereby detecting the magnetic field and optionally quantifying its strength.

The foregoing broadly describes the present disclosure without limitation. Variations and modifications as would be readily apparent to those skilled in the art are intended to be included. For the avoidance of doubt, the scope of the invention is defined by the claims.

The invention claimed is:

1. A magnetometer for detecting a magnetic field, comprising:
    a solid state electronic spin system containing a plurality of electronic spins and a solid carrier, wherein the electronic spins are configured to be capable of aligning with an external magnetic field in response to an alignment stimulus; and
    a detector configured to detect an alignment response of the electronic spins, such that the external magnetic field can be detected;
    wherein the electronic spins are provided as one or more groups, each group containing a plurality of spins, the plurality of spins in each of the one or more groups being arranged in a line that is angled at an angle $\theta$ with respect to the local direction of the external magnetic field at the said group, wherein the angle $\theta$ is between about 45° and about 60°.

2. A magnetometer according to claim 1, further configured to perturb the alignment of the electronic spins in a manner quantitatively related to the magnetic field strength, and to quantitatively detect the response of the electronic spins to the perturbation, whereby the magnetic field strength can be measured based on the detected response to the perturbation.

3. A magnetometer according to claim 1, further including a readout and/or display apparatus configured to indicate at least one of the presence, direction and strength of the magnetic field at a plurality of locations within the magnetic field.

4. A magnetometer according to claim 1, wherein each spin of a given group of spins is positionally locked in mutual alignment in or on the solid carrier with respect to other spin(s) in the group, wherein the magnetometer may optionally further comprise means for moving the group of spins collectively and/or moving the local magnetic field in order to achieve the desired angular alignment of the group of spins with the magnetic field.

5. A magnetometer according claim 1, wherein each spin of a given group of spins is positionally adjustable with respect to the other spin(s) of the group of spins, wherein the magnetometer may optionally further comprise means for moving all the spins of the group and/or the local magnetic field, for adjustment of the alignment according to the local direction of the magnetic field.

6. A magnetometer according to claim 1, wherein $\theta$ is between about 50° and about 57°, preferably wherein $\theta$ is between about 53° and about 56°, more preferably wherein $\theta$ is between about 54° and about 55°.

7. A magnetometer according to claim 6, wherein $\theta$ is 54.7°.

8. A magnetometer according to claim 6, which has a sensitivity to about 1 attoTesla and a spatial resolution to about 0.1 nm.

9. A magnetometer according to claim 1, wherein the electronic spin system consists of or includes at least one of: molecular spin systems; spin systems of silicon provided with Group V donors providing an electronic spin; spin systems of carbon provided with NV centres, negative silicon vacancies, neutral silicon vacancies or germanium vacancies; and spin systems of silicon carbide provided with neutral divacancies providing an electronic spin.

10. A magnetometer according to claim 1, wherein each group comprises at least 3 electronic spins arranged in a line, preferably wherein each group comprises at least 100 electronic spins arranged in a line.

11. A method of detecting a magnetic field, comprising:
    applying an alignment stimulus to a solid state electronic spin system containing a plurality of electronic spins and a solid carrier, thereby aligning the electronic spins with the magnetic field; and
    detecting said alignment response of the electronic spins thereby detecting the magnetic field;
    wherein the electronic spins are provided in the solid state electronic spin system as one or more groups, each group containing a plurality of spins, the plurality of spins in each of the one or more groups being arranged in a line that is angled at an angle $\theta$ with respect to the local direction of the magnetic field at the said group, wherein the angle $\theta$ is between about 45° and about 60°.

12. A method according to claim 11, further comprising perturbing the alignment of the electronic spins in a manner quantitatively related to the magnetic field strength, and quantitatively detecting the response of the electronic spins to the perturbation, whereby the magnetic field strength can be measured based on the detected response to the perturbation.

13. A method according to claim 11, wherein $\theta$ is between about 50° and about 57°, preferably wherein $\theta$ is between about 53° and about 56°, more preferably wherein $\theta$ is between about 54° and about 55°.

14. A method according to claim 13, wherein $\theta$ is 54.7°.

15. A method according to claim 13 which has a sensitivity to about 1 attoTesla and a spatial resolution to about 0.1 nm.

16. A method according to claim 11, wherein the electronic spin system consists of or includes at least one of: molecular spin systems; spin systems of silicon provided with Group V donors providing an electronic spin; spin systems of carbon provided with NV centres, negative silicon vacancies, neutral silicon vacancies or germanium vacancies; and spin systems of silicon carbide provided with neutral divacancies providing an electronic spin.

17. A method according to claim 11, wherein each group comprises at least 3 electronic spins arranged in a line, preferably wherein each group comprises at least 100 electronic spins arranged in a line.

* * * * *